United States Patent
Ishii

(10) Patent No.: US 9,911,876 B2
(45) Date of Patent: *Mar. 6, 2018

(54) SOLAR CELL MODULE

(71) Applicant: SANYO Electric Co., Ltd., Osaka (JP)

(72) Inventor: Yosuke Ishii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/619,253

(22) Filed: Feb. 11, 2015

(65) Prior Publication Data

US 2015/0162466 A1  Jun. 11, 2015

Related U.S. Application Data

(63) Continuation of application No. PCT/JP2012/073417, filed on Sep. 13, 2012.

(51) Int. Cl.
*H01L 31/00* (2006.01)
*H01L 31/0224* (2006.01)
*H01L 31/05* (2014.01)

(52) U.S. Cl.
CPC .. *H01L 31/022441* (2013.01); *H01L 31/0512* (2013.01); *H01L 31/0516* (2013.01); *Y02E 10/50* (2013.01)

(58) Field of Classification Search
CPC .......................................... H01L 31/00–31/78
See application file for complete search history.

(56) References Cited

U.S. PATENT DOCUMENTS

| | | | |
|---|---|---|---|
| 5,478,402 A * | 12/1995 | Hanoka | B32B 17/10036 136/251 |
| 9,640,677 B2 * | 5/2017 | Kudoh | H01L 31/02243 |
| 2005/0268959 A1* | 12/2005 | Aschenbrenner | H01L 31/0516 136/244 |
| 2009/0032081 A1 | 2/2009 | Saita et al. | |
| 2009/0183759 A1 | 7/2009 | Hishida | |
| 2009/0288697 A1 | 11/2009 | Shimizu et al. | |
| 2010/0084001 A1 | 4/2010 | Tsunomura et al. | |
| 2010/0108141 A1 | 5/2010 | Fukushima et al. | |

(Continued)

FOREIGN PATENT DOCUMENTS

| | | | | |
|---|---|---|---|---|
| EP | 2058868 A1 * | 5/2009 | | H05K 3/323 |
| JP | H11-204567 A | 7/1999 | | |

(Continued)

*Primary Examiner* — Shannon Gardner
(74) *Attorney, Agent, or Firm* — Metrolexis Law Group, PLLC

(57) ABSTRACT

Disclosed is a solar cell module that comprises a solar cell including a first electrode and a second electrode on one main surface thereof, a wiring member electrically connected to the solar cell, and a resin adhesive layer bonding the solar cell and the wiring member to each other. Each of the first and second electrodes includes finger parts extending in one direction. The wiring member includes an insulating substrate, and a wiring disposed on the insulating substrate, and electrically connected to the finger parts of the first or second electrode. The resin adhesive layer includes an adhesive layer body made of a resin, and a conductive member disposed in the adhesive layer. A portion of the conductive member digs into at least one of the finger parts and the wiring.

12 Claims, 3 Drawing Sheets

(56) References Cited

U.S. PATENT DOCUMENTS

| | | | |
|---|---|---|---|
| 2011/0126878 A1 | 6/2011 | Hacke et al. | |
| 2012/0042924 A1* | 2/2012 | Lee | H01L 31/02013 136/244 |
| 2013/0220540 A1 | 8/2013 | Fukushima et al. | |

FOREIGN PATENT DOCUMENTS

| | | |
|---|---|---|
| JP | 2001-343903 A | 12/2001 |
| JP | 2007-214533 A | 8/2007 |
| JP | 2008-085225 A | 4/2008 |
| JP | 2009-054981 A | 3/2009 |
| JP | 2009-176782 A | 8/2009 |
| JP | 2012-142456 A | 7/2012 |
| WO | 2008139995 A1 | 11/2008 |

* cited by examiner

SOLAR CELL MODULE

CROSS REFERENCE TO RELATED APPLICATIONS

This application is a continuation application of International Application No. PCT/JP2012/073417, filed on Sep. 13, 2012, entitled "SOLAR CELL MODULE", the entire contents of which are incorporated herein by reference.

TECHNICAL FIELD

The disclosure relates to solar cell modules.

BACKGROUND ART

As a solar cell module capable of achieving high output characteristics, a solar cell module including a back contact solar cell with both first and second electrodes provided on the back side thereof is known (see Japanese Patent Application Publication No. 2012-142456, for example, and others).

In the solar cell module described in Japanese Patent Application Publication No. 2012-142456, multiple solar cells are electrically connected to each other via a printed circuit board. Wirings of the printed circuit board are electrically connected to finger parts of a first or second electrode of the solar cell. This art further states that a printed circuit board and a solar cell may be connected to each other with a resin adhesive layer having anisotropic conductivity.

SUMMARY OF THE INVENTION

A solar cell module according to an embodiment includes a solar cell, a wiring member, and a resin adhesive layer. The solar cell includes first and second electrodes on one main surface side thereof. The wiring member is electrically connected to the solar cell. The resin adhesive layer bonds the solar cell and the wiring member to each other. Each of the first and second electrodes includes finger parts extending in one direction. The wiring member includes an insulating substrate and a wiring. The wiring is disposed on the insulating substrate. The wiring is electrically connected to the finger parts of the first or second electrode. The resin adhesive layer includes an adhesive layer body, and a conductive member. The adhesive layer body is made of resin. The conductive member is disposed in the adhesive layer body. A portion of the conductive member digs into at least one of the finger parts and the wiring.

BRIEF DESCRIPTION OF THE DRAWINGS

FIG. 4 does not present first and second protective members and a bonding layer.

DETAILED DESCRIPTION

Figure 1:
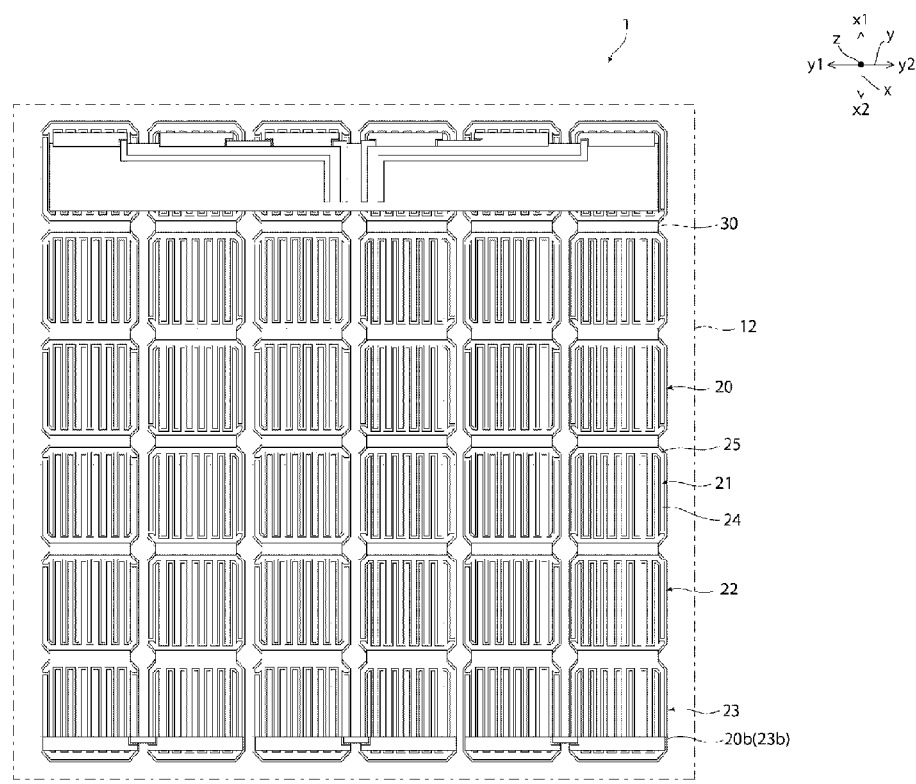
FIG. 1 is a schematic plan view of a solar cell module according to an embodiment.

Hereinafter, embodiments of solar cell modules are described. However, the embodiments described below are merely illustrative. The invention is not limited to the embodiments described below.

In the figures referred to for describing the embodiments, a member having a substantially same function is referred to with a same reference numeral. Figures referred to in the description of the embodiments are provided schematically. Therefore, the dimension ratio or the like of an object drawn in a figure may differ from that of a real object. The dimension ratio or the like of an object may be different between figures. The dimension ratio or the like of a specific object should be determined by considering the description given below.

As illustrated in FIG. 1, solar cell module 1 includes solar cells 20. Solar cells 20 are electrically connected to each other via wiring member 30.

Solar cells 20 are disposed within bonding layer 13 filled between first protective member 11 and second protective member 12. First protective member 11 may be made of, for example, a glass plate, a resin plate, a ceramic plate, or the like. On the other hand, second protective member 12 may be made of a resin sheet, a resin sheet having a barrier layer such as a metal layer and an inorganic oxide layer, a glass plate, a resin plate, a ceramic plate or the like. Bonding layer 13 may is made of a crosslinkable resin such as ethylene and vinyl acetate copolymer (EVA), and a non-crosslinkable resin such as olefin.

Figure 2:
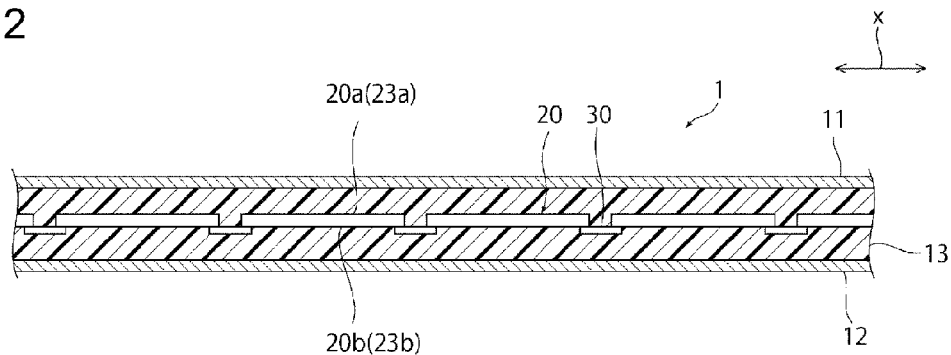
FIG. 2 is a schematic cross section of a solar cell module according to an embodiment.

As illustrated in FIG. 2, solar cell 20 includes light-receiving surface 20a, and back surface 20b. In solar cell 20, light-receiving surface 20a is oriented toward first protective member 11, and back surface 20b is oriented toward second protective member 12. Light-receiving surface is a main surface mainly receiving light among a pair of main surfaces of the solar cell, and the other main surface forms the back surface.

Solar cell 20 includes photoelectric conversion body 23. Photoelectric conversion body 23 generates carriers such as electrons or holes when receiving light. Photoelectric conversion body 23 may is made of, for example, a crystal semiconductor plate. Photoelectric conversion body 23 includes first and second main surfaces 23a, 23b. First main surface 23a forms light-receiving surface 20a. Second main surface 23b forms back surface 20b.

Figure 3:
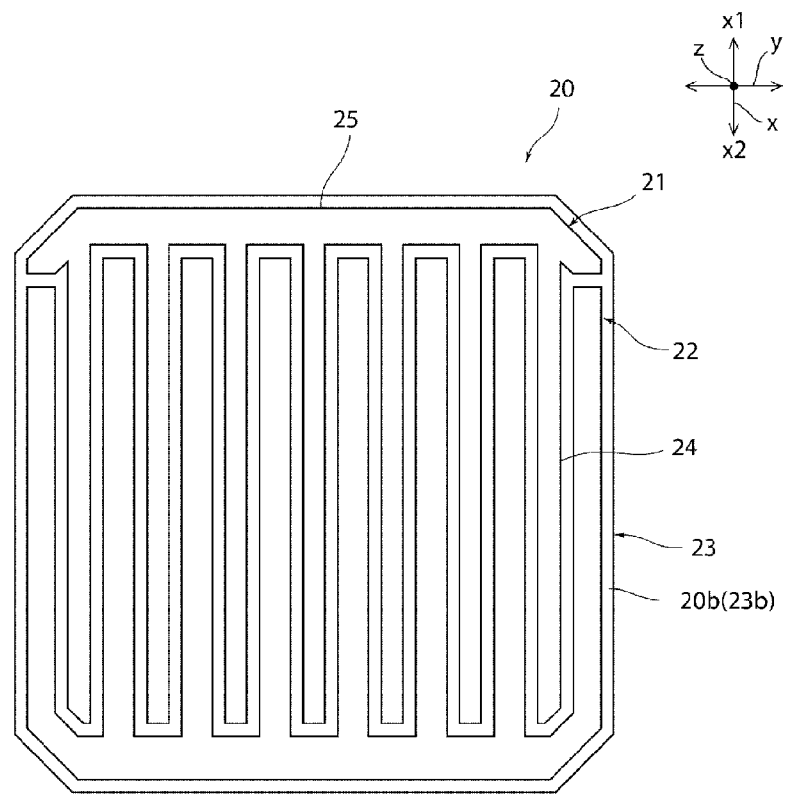
FIG. 3 is a schematic back side view of a solar cell module according to an embodiment.
Figure 4:
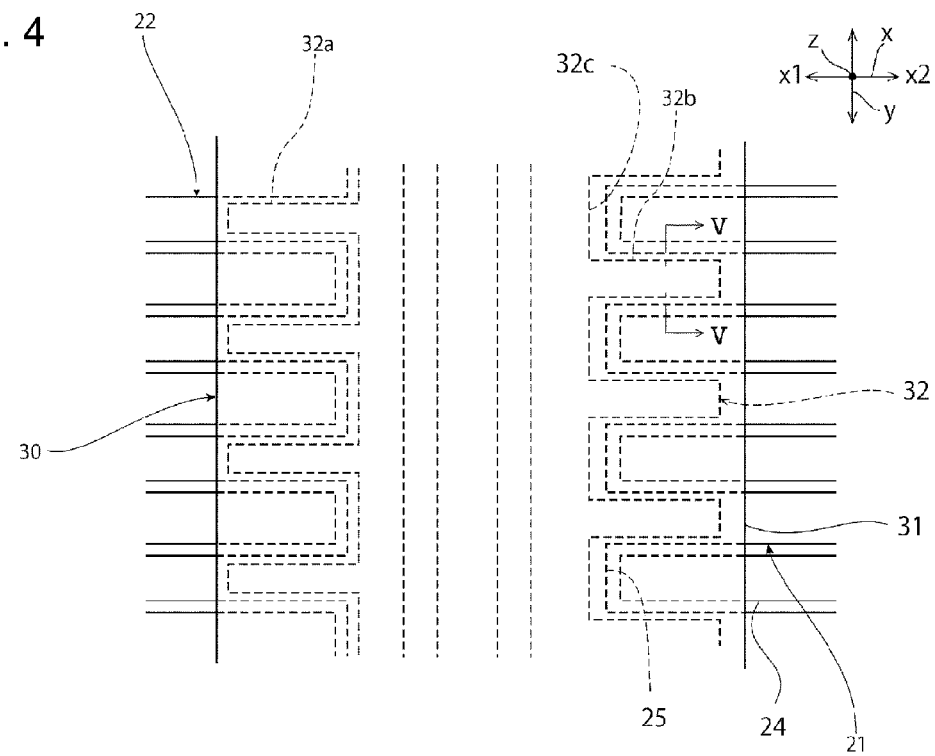
FIG. 4 is a schematic back side view of a portion of a solar cell module according to an embodiment.

As illustrated in FIG. 3, first electrode 21 and second electrode 22 are disposed on second main surface 23b. Each of first electrode 21 and second electrode 22 includes finger parts 24, and bus bar part 25. However, the first and second electrodes according to the invention may include finger parts only without having a bus bar part.

Finger parts 24 extend in the X axis direction. Finger parts 24 are disposed at intervals therebetween in the Y axis direction. Finger parts 24 of first electrode 21 and finger part 24s of second electrode 22 are disposed alternately in the Y axis direction. Bus bar part 25 extends in the Y axis direction. Bus bar part 25 of the first electrode 21 is disposed at an end of x1 side in the X axis direction on second main surface 23b. Bus bar part 25 of the second electrode 22 is disposed at an end of x2 side in the X axis direction on second main surface 23b. In each of first and second electrodes 21, 22, finger parts 24 are electrically connected with bus bar part 25.

Solar cells 20 adjacent in the X axis direction are electrically connected to each other via wiring member 30 disposed on second main surface 23b. Specifically, in solar cells 20 adjacent in the X axis direction, first electrode 21 of one solar cell 20, and second electrode 22 of other solar cell 20 are electrically connected to each other via wiring member 30.

Wiring member 30 includes insulating substrate 31 and wiring 32. Insulating substrate 31 may is made of, for example, a resin sheet or a ceramic plate. Wiring 32 is disposed on a surface, which orient to the second main surface 23b, of insulating substrate 31. Wiring 32 is electrically connected to finger part 24 of first electrode on one solar cell 20, and finger part 24 of second electrode 22 on the other solar cell 20. Specifically, wiring 32 includes first linear parts 32a, second linear parts 32b, and connection part 32c. Connection part 32c extends in the Y axis direction between adjacent solar cells 20 while extending from an end of one solar cell 20 on the x1 side in the X axis direction to an end of other solar cell 20 on the x2 side in the X axis direction. Connection part 32c covers at least portions of bus bar part 25 of first electrode 21 on one solar cell 20, and bus bar part 25 of second electrode 22 in other solar cell 20.

First linear parts 32a are electrically connected to connection part 32c. First linear parts 32a extend in a convex shape from connection part 32c toward the x1 side in the X axis direction. First linear parts 32a are arranged at intervals therebetween in the Y axis direction. At least some of first linear parts 32a are disposed on finger parts 24 of second electrode 22 on the other solar cell 20. First linear parts 32a are electrically connected to finger parts 24 of second electrode 22.

Second linear parts 32b are electrically connected to connection part 32c. Second linear parts 32b extend in a convex shape from connection part 32c toward the x2 side in the X axis direction. Second linear parts 32b are disposed at intervals therebetween in the Y axis direction. At least some of second linear parts 32b are positioned on finger parts 24 of first electrode 21 on one solar cell 20. Second linear parts 32b are electrically connected to finger parts 24 of first electrode 21.

Figure 5:
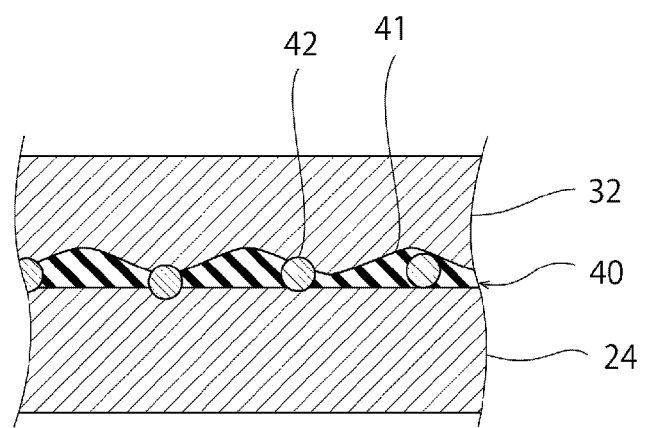
FIG. 5 is a schematic cross section of a V-shaped portion of FIG. 4.

Solar cell 20 and wiring member 30 are bonded to each other via resin adhesive layer 40 illustrated in FIG. 5. Resin adhesive layer 40 includes adhesive layer body 41, and conductive members 42. Adhesive layer body 41 is made of a resin. Specifically, adhesive layer body 41 is made of a cured resin adhesive. Conductive members 42 are disposed within adhesive layer body 41. At least a surface layer of each conductive member 42 is made of a conductive material. That is, according to the invention, the conductive member may be conductive on at least a surface thereof, and does not need to have conductivity in the entirety. Conductive member 42 may be made of, for example, a metal particle, or inorganic oxide particle coated with a metal layer.

In solar cell module 1, conductive member 42 digs into at least one of finger part 24 and wiring 32 (specifically, first or second linear part 32a, 32b). In other words, a portion of conductive member 42 is embedded within at least one of finger part 24 and wiring 32. This provides an increased contact area between conductive member 42 and at least one of finger part 24 and wiring 32, and thereby reduces electrical resistivity between wiring member 30 and solar cell 20. Accordingly, improved output characteristics can be obtained. This also strengthens an anchoring effect by conductive member 42, which makes electrical breakdown of wiring 32 and electrodes 21, 22 less likely. Thus, improved reliability can be obtained. In order to obtain more improved output characteristics and reliability, it is preferable that conductive members 42 digs into both finger part 24 and wiring 32. All conductive members 42 do not need to dig into at least one of finger part 24 and wiring 32, but at least one conductive member 42 may dig into at least one of finger part 24 and wiring 32.

In order to suitably dig conductive member 42 into finger part 24 and wiring 32, it is preferable that at least one of finger part 24 and wiring 32 have a rough surface. This makes it possible to increase stress applied between conductive member 42 and finger part 24 or wiring 32 in bonding wiring member 30 and solar cell 20 together with pressure. This facilitates digging of conductive member 42 into finger part 24 and wiring 32. Specifically, in solar cell module 1, wiring 32 is provided with a rough surface such that conductive member 42 easily can be dug into wiring 32.

In order to suitably dig conductive member 42 into finger part 24 and wiring 32, the average particle diameter of conductive member 42 is preferably smaller than the average pitch of roughness (shortest distance between apexes of adjacent projection portions), more preferably 0.7 times or less and even more preferably 0.5 times or less than the average pitch of roughness. Specifically, the average particle diameter of conductive member 42 is preferably, for example, between 15 µm and 1 µm, more preferably between 10 µm and 2 µm, and even more preferably between 5 µm and 2 µm. The average pitch of roughness is preferably between 40 µm and 5 µm, and more preferably between 20 µm and 10 µm.

A method of providing roughness to the surface is not limited. For example, roughness may be provided by subjecting the surface to roughing treatment. The roughing treatment on the surface provides the rough surface, and also reduces hardness of the surface layer. This facilitates digging of conductive member 42 into finger part 24 and wiring 32. Preferably used roughening treatments include, for example, a surface etching such as a multi-bond treatment.

In order to dig conductive member 42 into finger part 24 and wiring 32, conductive member 42 preferably has a spherical shape. Here, the spherical shape means a shape having an aspect ratio of 2 or less, where the aspect ratio is a ratio of the major axis diameter to the minor axis diameter ((major axis diameter)/(minor axis diameter)).

In order to dig conductive member 42 into finger part 24 and wiring 32, conductive member 42 preferably has hardness higher than a surface layer of at least one of finger part 24 and wiring 32. Preferably, for example, conductive member 42 is made of copper or a copper alloy, and a surface layer of at least one of finger part 24 and wiring 32 is made of tin or a tin alloy. Specifically, in solar cell module 1, conductive member 42 has hardness higher than the surface layer of finger part 24. More specifically, conductive member 42 includes copper or a copper alloy, and the surface layer of finger part 24 is made of tin or a tin alloy. This facilitates digging conductive member 42 into the surface layer of finger part 24. In solar cell module 1, the portion of finger part 24 other than the surface layer is made of copper or a copper alloy.

In this way, embodiments described above provides a solar cell module having improved output characteristics.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
   solar cells, each including a first electrode and a second electrode on one common main surface thereof;

each of the first and second electrodes including finger
parts extending in one direction and a bus bar electrode
connected to the finger parts,
a wiring member comprising an insulating substrate and
a conductive wiring disposed on the insulating substrate and electrically connected to the finger parts,
the wiring member electrically connecting two adjacent
solar cells by covering the bus bar electrode of a first
electrode of one solar cell, contacting the finger parts of
the first electrode of the one solar cell, covering the bus
bar electrode of a second electrode of an adjacent solar
cell, and contacting the finger parts of the second
electrode of the adjacent solar cell;
a first protective member facing away from the one
common main surface of each of the solar cells;
a second protective member facing the one common main
surface of each of the solar cells, the solar cells and the
wiring member being sandwiched by the first protective
member and the second protective member; and
a resin adhesive layer bonding the solar cell and the
wiring member to each other comprising,
an adhesive layer body made of a resin; and
a conductive member disposed in the resin adhesive
layer,
wherein
a portion of the conductive member digs into at least
one of the finger parts and the conductive wiring,
the conductive wiring includes:
linear parts extending in the one direction on the
respective finger parts; and
a connection part extending in a direction perpendicular to the one direction, the linear parts and the
connection part being electrically connected to
each other,
the insulating substrate of the wiring member partially
covers both the first and second electrodes in the one
solar cell and covers only facing ends of the two
adjacent solar cells in the one direction, and
the linear parts of the conductive wiring of the wiring
member cover one of the first and second electrodes
and do not cover the other of the first and second
electrodes in the one solar cell.

2. The solar cell module according to claim 1, wherein the
at least one of the finger parts and the conductive wiring has
a rough surface.

3. The solar cell module according to claim 1, wherein the
conductive member has hardness higher than a surface of the
at least one of the finger parts and the conductive wiring.

4. The solar cell module according to claim 3, wherein the
conductive member is made of copper or a copper alloy, and
the surface of the at least one of the finger parts and the
conductive wiring is made of tin or a tin alloy.

5. The solar cell module according to claim 2, wherein the
conductive member has a spherical shape.

6. The solar cell module according to claim 2, wherein the
rough surface has an average pitch of roughness between 40
µm and 5 µm.

7. The solar cell module according to claim 6, wherein the
rough surface has an average pitch of roughness between 20
µm and 10 µm.

8. The solar cell module according to claim 6, wherein the
average particle diameter of the conductive member is 0.7
times or less than the average pitch of roughness.

9. The solar cell module according to claim 3, wherein
the first and second electrodes and the conductive wiring
of the wiring member contain a common material, and
the conductive member digs into both the first electrode
and the conductive wiring or both the second electrode
and the conductive wiring.

10. The solar cell module according to claim 9, wherein
the common material is copper or a copper alloy.

11. The solar cell module according to claim 1, further
comprising a bonding layer between the first protective
member and the second protective member, wherein
the insulating substrate and the conductive wiring of the
wiring member are within the bonding layer.

12. The solar cell module according to claim 1, wherein
the insulating substrate of the wiring member partially
overlaps with the two adjacent solar cells in a direction
orthogonal to the one common main surface of the solar cell.

* * * * *